US012641819B2

(12) United States Patent
Yang et al.

(10) Patent No.: US 12,641,819 B2
(45) Date of Patent: May 26, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Po-Yu Yang, Hsinchu City (TW); Chun-Hsien Lin, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 365 days.

(21) Appl. No.: 18/227,979

(22) Filed: Jul. 31, 2023

(65) Prior Publication Data

US 2024/0332421 A1 Oct. 3, 2024

(30) Foreign Application Priority Data

Mar. 29, 2023 (TW) .................................. 112111938

(51) Int. Cl.
| | |
|---|---|
| *H10D 30/62* | (2025.01) |
| *H10D 30/01* | (2025.01) |
| *H10D 64/01* | (2025.01) |
| *H10D 64/27* | (2025.01) |
| *H10D 64/68* | (2025.01) |

(52) U.S. Cl.
CPC ....... *H10D 30/6211* (2025.01); *H10D 30/024* (2025.01); *H10D 64/01* (2025.01); *H10D 64/514* (2025.01); *H10D 64/685* (2025.01)

(58) Field of Classification Search
CPC .. H10D 30/6211; H10D 64/01; H10D 64/685; H10D 30/024; H10D 64/514
See application file for complete search history.

(56) References Cited

U.S. PATENT DOCUMENTS

| | | | |
|---|---|---|---|
| 6,548,859 B2 | 4/2003 | Maegawa | |
| 2005/0250285 A1* | 11/2005 | Yoon ...................... | H10D 86/01 |
| | | | 438/157 |
| 2012/0248400 A1* | 10/2012 | Yu .......................... | H10B 63/20 |
| | | | 257/E47.001 |
| 2016/0056181 A1 | 2/2016 | Anderson | |
| 2017/0133486 A1* | 5/2017 | Zhou .................... | H10D 64/017 |
| 2017/0148914 A1 | 5/2017 | Lee et al. | |

FOREIGN PATENT DOCUMENTS

| | | |
|---|---|---|
| JP | H054822 B2 | 1/1993 |
| KR | 10-2017-0061233 | 6/2017 |
| KR | 10-2019-0015270 | 2/2019 |
| KR | 10-2020-0060678 A | 6/2020 |
| KR | 10-2021-0029643 A | 3/2021 |
| WO | 2018/004680 | 1/2018 |

* cited by examiner

*Primary Examiner* — Christine A Enad
(74) *Attorney, Agent, or Firm* — Winston Hsu

(57) ABSTRACT

A semiconductor device includes a first fin structure, an insulating structure, a first groove and a gate structure. The first fin structure is extended along a first direction on a substrate. The insulating structure surrounds the first fin structure. The first groove is extended along the first direction and disposed between the first fin structure and the insulating structure. The first groove exposes a first portion of the substrate. The gate structure is extended along a second direction on the first fin structure. At least a portion of the gate structure is disposed in the first groove. The gate structure includes a gate dielectric layer disposed on the first fin structure and the first portion of the substrate.

13 Claims, 10 Drawing Sheets

SEMICONDUCTOR DEVICE AND METHOD FOR FABRICATING THE SAME

BACKGROUND OF THE INVENTION

1. Field of the Invention

The present disclosure relates to the field of semiconductor devices, and more particularly, to a semiconductor device favorable for maintaining an effective width and a method for fabricating the same.

2. Description of the Prior Art

In order to reduce production costs and improve competitive advantages, the dimensions of semiconductor devices are continued to be reduced. However, with the miniaturization of the semiconductor device, how to maintain the effective width of the semiconductor device in a limited area has become a major challenge. When the effective width is low, the transconductance of the semiconductor device is excessively low and the noise is excessively high, which affects the subsequent application of the semiconductor device.

SUMMARY OF THE INVENTION

According to one aspect of the present disclosure, a semiconductor device includes a first fin structure, an insulating structure, a first groove and a gate structure. The first fin structure is extended along a first direction on a substrate. The insulating structure surrounds the first fin structure. The first groove is extended along the first direction and disposed between the first fin structure and the insulating structure. The first groove exposes a first portion of the substrate. The gate structure is extended along a second direction on the first fin structure. At least a portion of the gate structure is disposed in the first groove. The gate structure includes a gate dielectric layer disposed on the first fin structure and the first portion of the substrate.

According to another aspect of the present disclosure, a semiconductor device includes a plurality of fin structures, an insulating structure, a plurality of first grooves, at least one second groove and a gate structure. The plurality of fin structures are extended along a first direction on a substrate. The insulating structure surrounds the plurality of fin structures. The plurality of first grooves are extended along the first direction, wherein each of the first grooves is disposed between one of the fin structures and the insulating structure, and each of the first grooves exposes a first portion of the substrate. The at least one second groove is extended along the first direction, wherein the at least one second groove is disposed between two of the fin structures, and the at least one second groove exposes a second portion of the substrate. The gate structure is disposed on the plurality of fin structures, wherein the gate structure includes a plurality of gate portions extended along a second direction, at least a portion of each of the gate portions is disposed in the plurality of first grooves and the at least one second groove, and each of the gate portions includes a gate dielectric layer disposed on the plurality of fin structures and the first portion and the second portion of the substrate.

According to yet another aspect of the present disclosure, a method for fabricating a semiconductor device includes steps as follows. A first fin structure extended along a first direction on a substrate is formed. An insulating structure surrounds the first fin structure is formed. A first groove extended along the first direction and disposed between the first fin structure and the insulating structure is formed, wherein the first groove exposes a first portion of the substrate. A gate structure extended along a second direction on the first fin structure is formed, wherein at least a portion of the gate structure is disposed in the first groove, and the gate structure includes a gate dielectric layer disposed on the first fin structure and the first portion of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
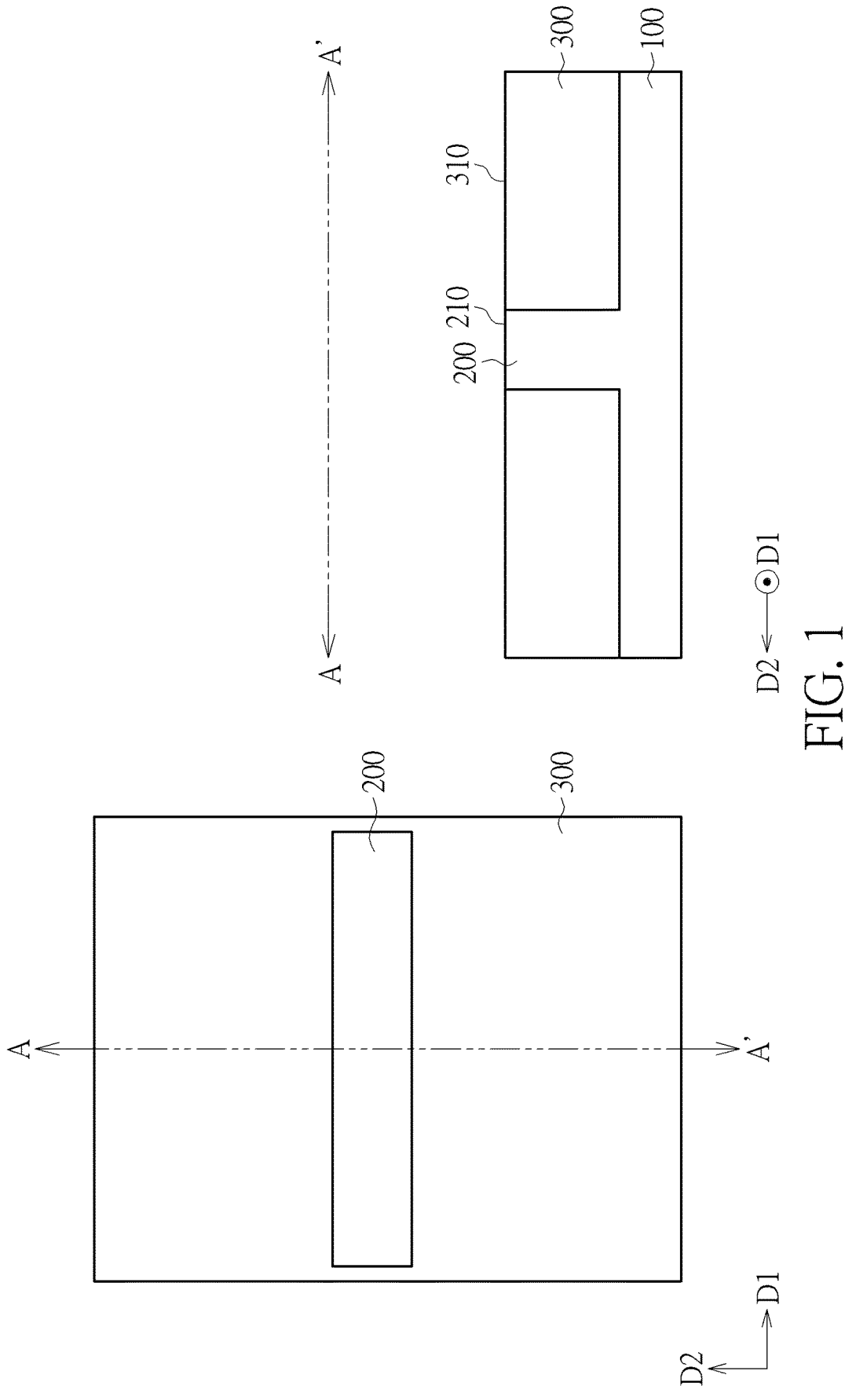
FIG. 1, FIG. 2, FIG. 3, FIG. 4, FIG. 5, FIG. 6 and FIG. 7 are schematic diagrams showing steps for fabricating a semiconductor device according to one embodiment of the present disclosure.

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure (s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

According to one embodiment of the present disclosure, a method 900 for fabricating a semiconductor device includes Step 910 to Step 940. In Step 910, a first fin structure extended along a first direction on a substrate is formed. In Step 920, an insulating structure surrounding the first fin structure is formed. In Step 930, a first groove extended along the first direction and disposed between the first fin structure and the insulating structure is formed, wherein the first groove exposes a first portion of the substrate. In Step 940, a gate structure extended along a second direction on the first fin structure is formed, wherein at least a portion of the gate structure is disposed in the first groove, and the gate structure includes a gate dielectric layer disposed on the first fin structure and the first portion of the substrate. When the number of the fin structures is greater than two, the method 900 for fabricating the semiconductor device may further include Step 950 and Step 960. In Step 950, a second fin structure extended along the first direction on the substrate is formed. In Step 960, a second groove extended along the first direction and disposed between the first fin structure and the second fin structure is formed, wherein the second groove exposes a second portion of the substrate, and the gate dielectric layer is further disposed on the second fin structure and the second portion of the substrate.

Please refer to FIG. 1 to FIG. 7, which are schematic diagrams showing steps for fabricating a semiconductor device 10 according to one embodiment of the present disclosure, and are used to illustrate the method 900 for fabricating the semiconductor device. In FIG. 1, the left portion shows a schematic top view of a semi-finished semiconductor device, and the right portion shows a schematic cross-sectional view taken along line A-A' in the left portion. First, a fin structure 200 extended along a first direction D1 on a substrate 100 is formed (Step 910). Next, an insulating structure 300 surrounding the fin structure 200 is formed (Step 920). The substrate 100 may be a semiconductor substrate, such as a silicon substrate, an epitaxial silicon substrate, a silicon carbide substrate or a silicon on insulator (SOI) substrate. The fin structure 200 may be formed by methods as follows. For example, a patterned mask (not shown) is formed on the substrate 100, and then an etching process is performed to transfer the pattern of the patterned mask to the substrate 100 to form the fin structure 200. Alternatively, a patterned mask (not shown) may be formed on the substrate 100, and then a semiconductor layer, such as a semiconductor layer including silicon germanium, may be formed on the portion of the substrate 100 exposed from the patterned mask by an epitaxial growth process, and the semiconductor layer may be used as the fin structure 200. Alternatively, the fin structure 200 may be formed by a sidewall image transfer (SIT) process, which is well known in the art and is not repeated herein.

The insulating structure 300 may be formed as follows. For example, a dielectric material is deposited on the substrate 100 and the fin structure 200 by a deposition process, and then a portion of the dielectric material is removed by a planarization process such as chemical mechanical polishing (CMP) process, so that a top surface of the remaining dielectric material is aligned with the top surface 210 of the fin structure 200, and the fabrication of the insulating structure 300 is completed. The insulating structure 300 may be, for example, a shallow trench isolation (STI). The insulating structure 300 is configured to provide electrical isolation function. The material of the insulating structure 300 may include dielectric materials such as silicon dioxide.

Figure 2:
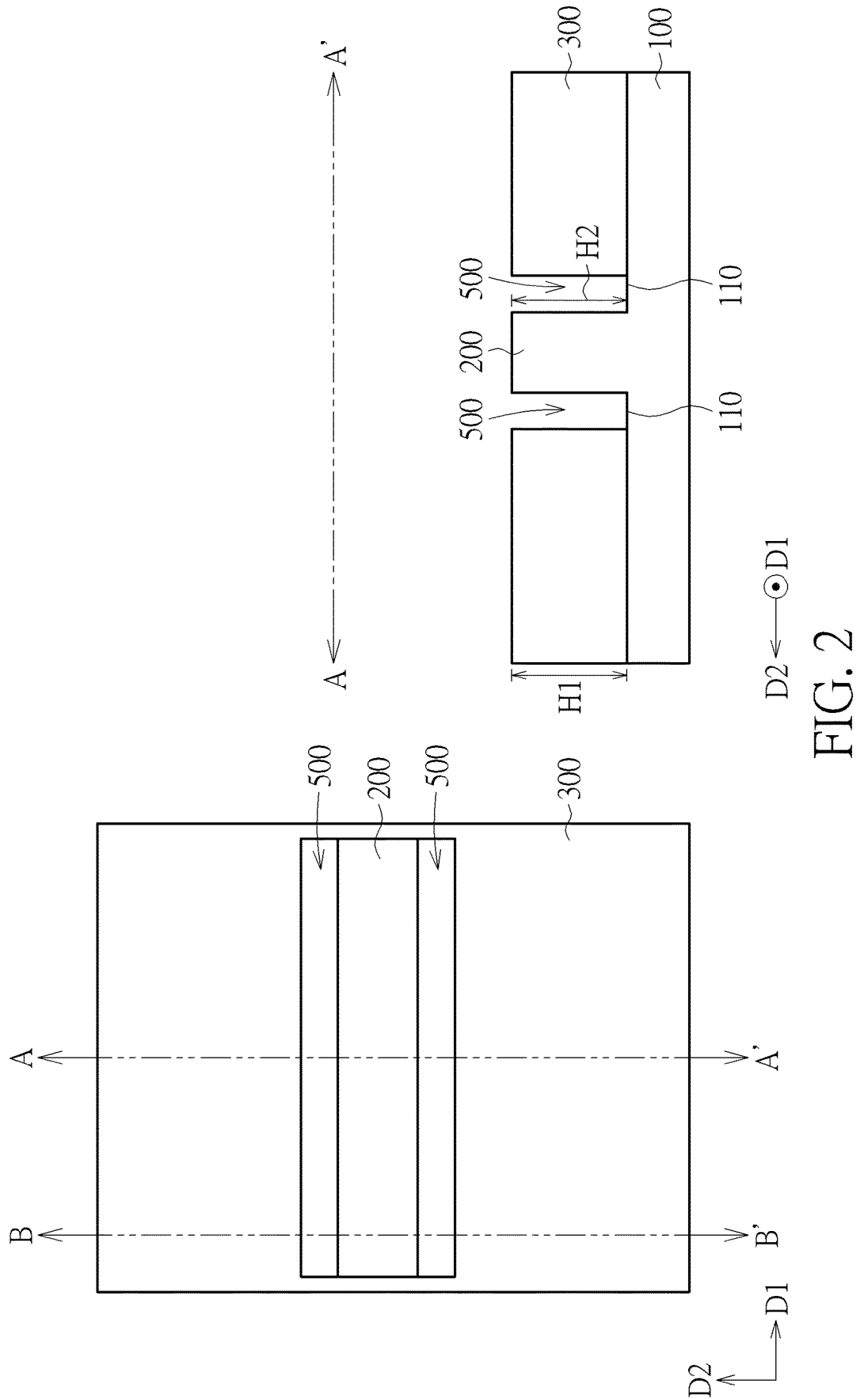

In FIG. 2, the left portion shows a schematic top view of a semi-finished semiconductor device, and the right portion shows a schematic cross-sectional view taken along line A-A' in the left portion. As shown in FIG. 2, two grooves 500 extended along the first direction D1 and disposed between the fin structure 200 and the insulating structure 300 are formed, and each of the grooves 500 exposes a first portion 110 of the substrate 100 (Step 930). The grooves 500 may be formed as follows. For example, a patterned mask (not shown) such as a photoresist is formed on the substrate 100, and then an etching process is performed to form the grooves 500. Afterward, the patterned mask is removed to complete the fabrication of the grooves 500. A depth H2 of each of the grooves 500 may be equal to a height H1 of the insulating structure 300. Thereby, the fin structure 200 and the insulating structure 300 do not directly contact with each other in the second direction D2. Herein, the second direction D2 is perpendicular to the first direction D1, which is exemplarily and the present disclosure is not limited thereto. In other embodiment, the second direction D2 may not be perpendicular to the first direction D1. Cases that the first direction D1 is not parallel to the second direction D2 are all within the scope of the present disclosure.

Figure 3:
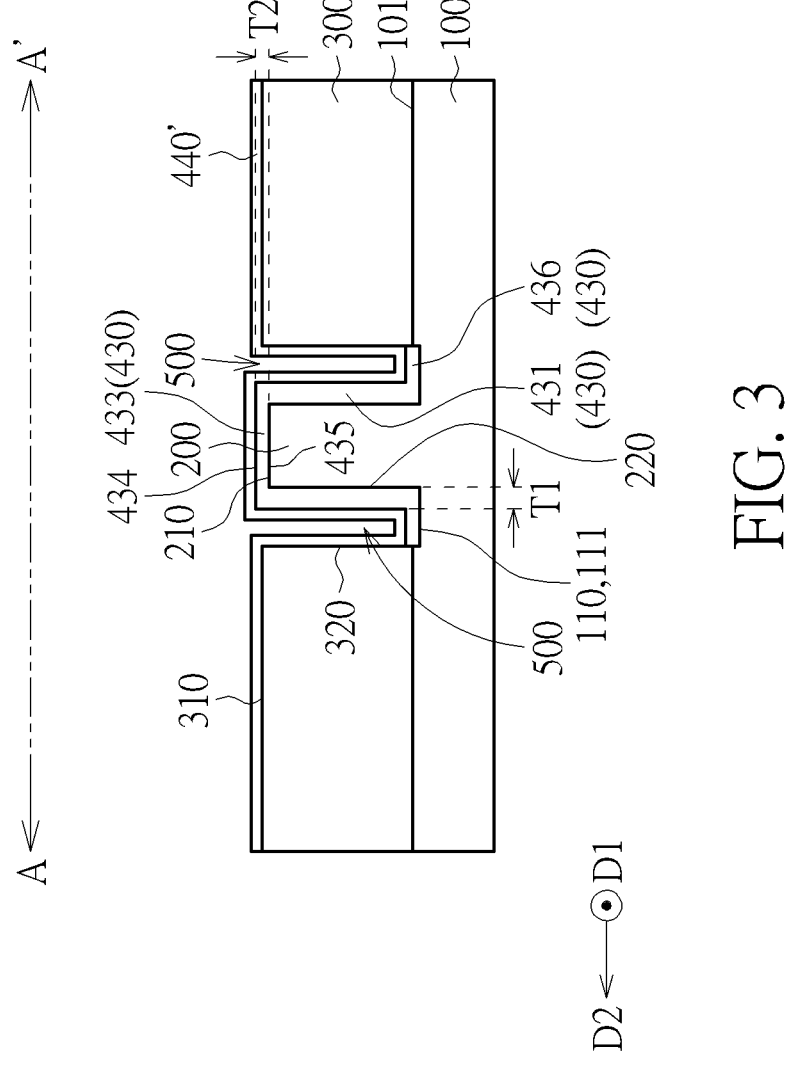
Figure 4:
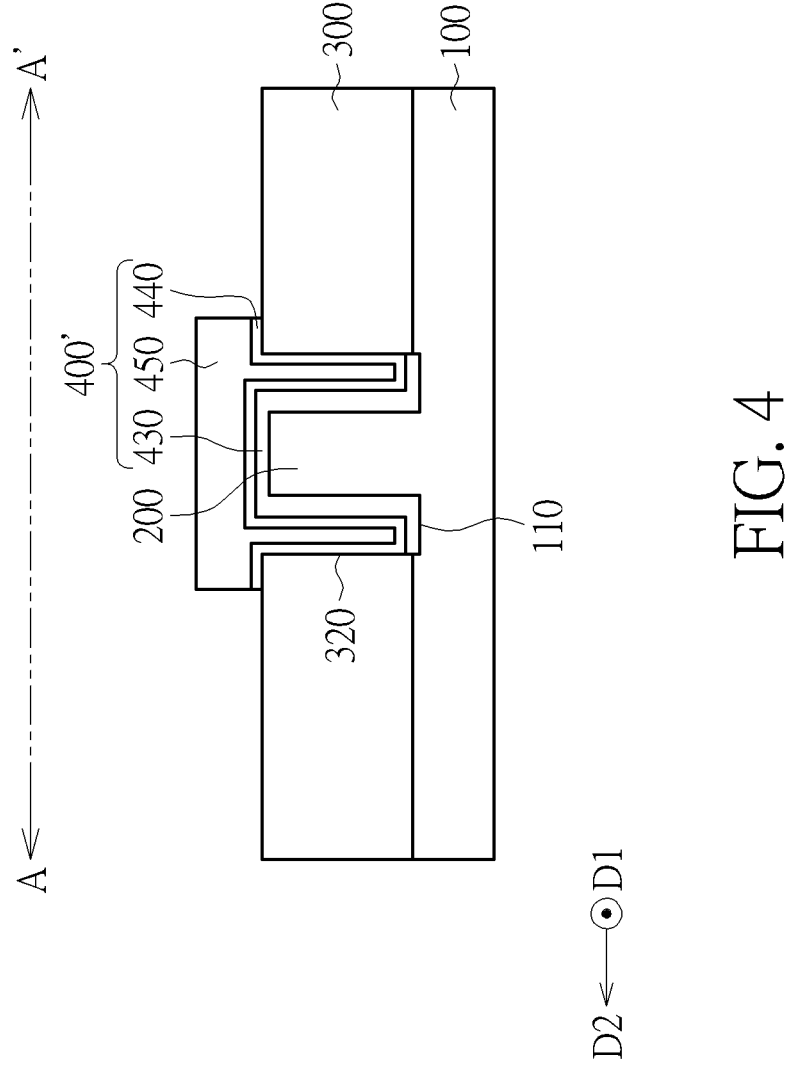

FIG. 3 and FIG. 4 show schematic cross-sectional views taken along line A-A' of semi-finished semiconductor devices, and the position of the line A-A' may refer to FIG. 2. As shown in FIG. 3 and FIG. 4, a gate structure 400' extended along the second direction D2 on the fin structure 200 is formed (Step 940). First, as shown in FIG. 3, a gate dielectric layer 430 disposed on the fin structure 200 and the first portions 110 of the substrate 100 is formed. The gate dielectric layer 430 may be formed by a thermal oxidation process. Thereby, the silicon in the fin structure 200 and the portions (i.e., the first portions 110) of the substrate 100 that is not shielded by the insulating structure 300 reacts with oxygen to form the gate dielectric layer 430, and the gate dielectric layer 430 may include silicon dioxide. Since a portion of the silicon in the fin structure 200 and the first portions 110 of the substrate 100 is consumed by reacting with oxygen, the top surface 210 of the fin structure 200 changes from being aligned with the top surface 310 of the insulating structure 300 (as shown in FIG. 2) to be lower than the top surface 310 of the insulating structure 300 (as shown in FIG. 3). Similarly, the top surface 111 of the first portion 110 of the substrate 100 is also lower than the top surface 101 of the portion of the substrate 100 located below the insulating structure 300.

The gate dielectric layer 430 may include vertical portions 431 and horizontal portions. Herein, the horizontal portions exemplarily include the first horizontal portion 433 and the second horizontal portions 436. The vertical portion 431 is disposed on a side surface 220 of the fin structure 200. Each of the vertical portions 431 has a first thickness T1. The first horizontal portion 433 is disposed on the top surface 210 of the fin structure 200, and the second horizontal portions 436 are disposed on the first portions 110 of the substrate 100 (i.e., on the top surface 111 of the substrate 100). Each of the vertical portions 431 is disposed between the first horizontal portion 433 and the second horizontal portion 436. Each of the first horizontal portion 433 and the second horizontal portions 436 has a second thickness T2. The first thickness T1 is greater than the second thickness T2. For example, the crystal planes of the top surface 111 of the first portion 110 and the top surface 210 of the fin structure 200 may be different from the crystal plane of the side surface 220 of the fin structure 200. When performing the thermal oxidation process, the oxidation rates of the different crystal planes are different, so that the first thickness T1 is different from the second thickness T2. According to one embodiment of the present disclosure, when the substrate 100 is a silicon substrate, the crystal planes of the top surface 111 of the first portion 110 and the top surface 210 of the fin structure 200 may be <100>, and the crystal plane of the side surface 220 of the fin structure 200 may be <111> or <110>. The ratio of the first thickness T1 to the second thickness T2 may be 1.05 to 1.25, or may be 1.10 to 1.20.

Next, a deposition process may be performed to deposit a high dielectric constant (high-k) material on the gate dielectric layer 430 and the insulating structure 300 to form a high-K dielectric layer 440'. The materials of the high-K dielectric layer 440' may include a dielectric material with a dielectric constant greater than 3.9. Alternatively, the material of the high-K dielectric layer 440' may include a dielectric material with a dielectric constant of 8 to 40. For example, the material of the high-K dielectric layer 440' may include hafnium oxide (HfO$_2$), hafnium silicon oxide (HfSiO$_4$), hafnium silicon oxynitride (HfSiON) or aluminum oxide (Al$_2$O$_3$), which is only exemplarily, and the present disclosure is not limited thereto.

Next, as shown in FIG. 4, a deposition process may be performed to deposit a gate material on the high-k dielectric layer 440', and then the gate material and the high-k dielectric layer 440' are patterned. For example, a patterned mask (not shown) such as a photoresist may be formed on the gate material, and then an etching process may be performed to remove a portion of the gate material and a portion of the high-k dielectric layer 440' so as to formed a patterned gate material layer 450 and a patterned high-K dielectric layer 440. Afterward, the patterned mask can be removed to complete the fabrication of the gate structure 400'. In the step, the portion of the high-K dielectric layer 440' which is not covered by the patterned gate material layer 450 is removed, and only the portion of the high-K dielectric layer 440' which is covered by the patterned gate material layer 450 is reserved to form the patterned high-k dielectric layer 440. The material of the gate material layer 450 may include amorphous silicon or polycrystalline silicon. The gate structure 400', from bottom to top, includes the gate dielectric layer 430, the high-K dielectric layer 440 and the gate material layer 450.

Figure 5:
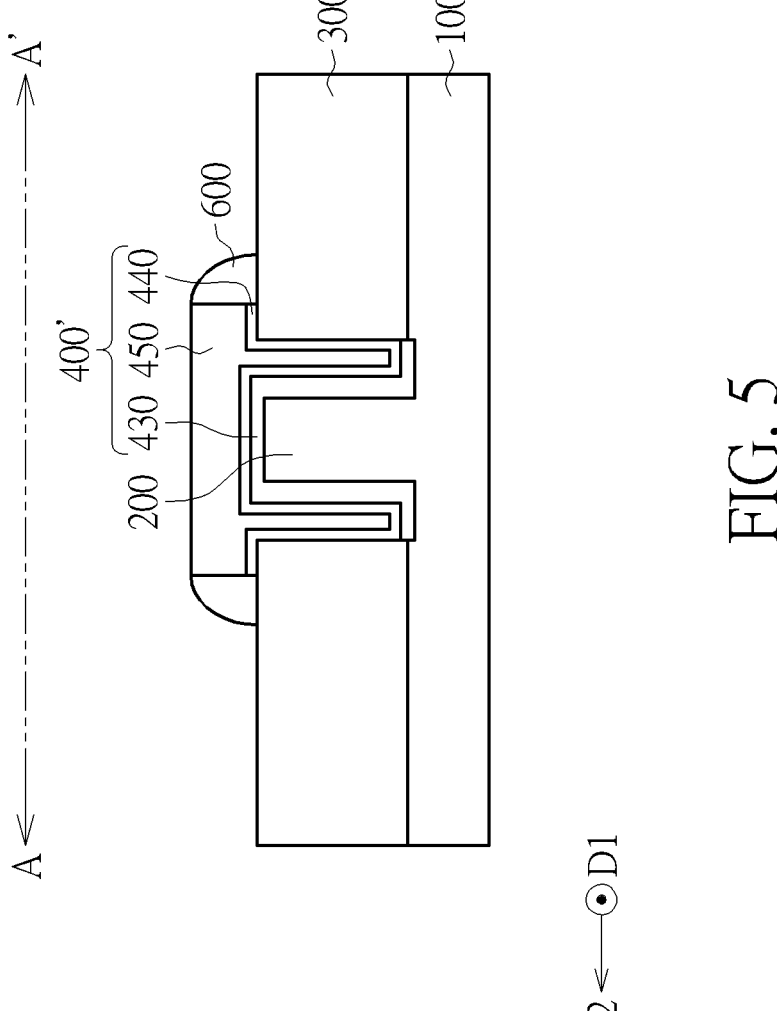
Figure 6:
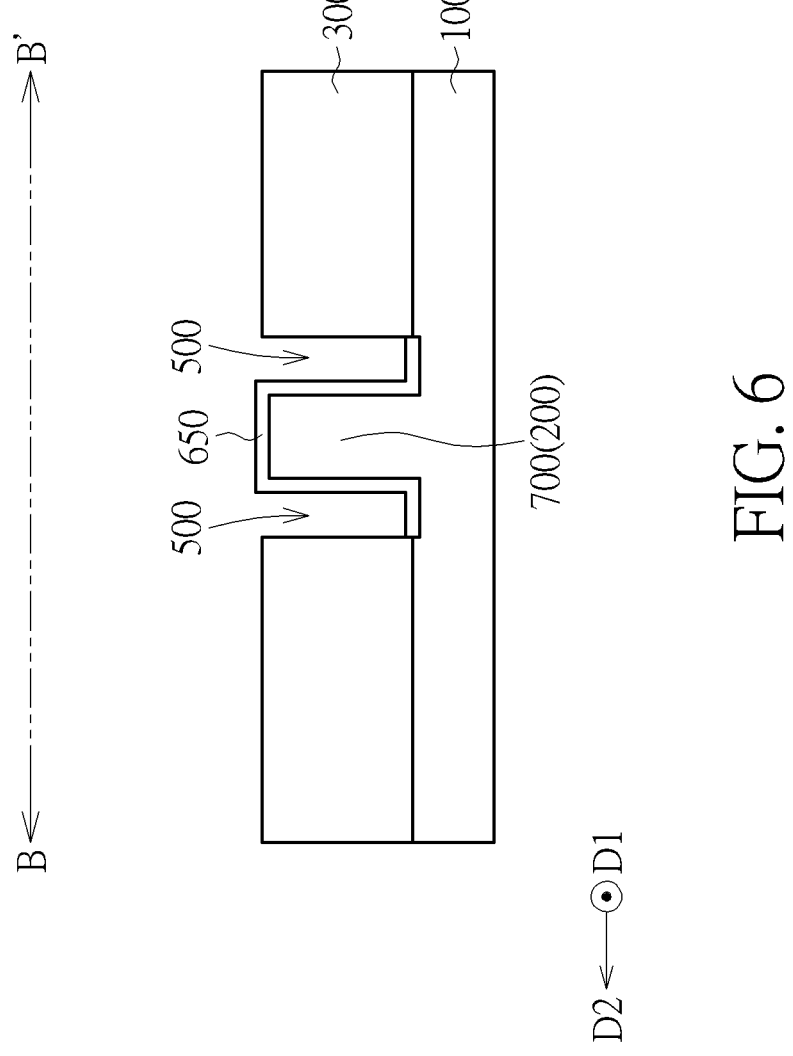

Next, light doped drains (LDDs) (not shown) may be formed in the portions of the fin structure 200 located on both sides of the gate structure 400'. FIG. 5 shows a schematic cross-sectional view taken along line A-A' of a semi-finished semiconductor device, and the position of the line A-A' may refer to FIG. 2. As shown in FIG. 5, a spacer 600 is formed to surround a sidewall of the gate structure 400'. The material of the spacer 600 may include oxides and/or nitrides, such as silicon dioxide, silicon nitride, silicon oxynitride or silicon carbonitride. FIG. 6 shows schematic cross-sectional view taken along line B-B' of a semi-finished semiconductor device, and the position of the line B-B' may refer to FIG. 2. As shown in FIG. 6, source/drain regions 700 may be formed in the portions of the fin structure 200 located on both sides of the gate structure 400'. The dopants of the source/drain regions 700 may be adjusted depending on the semiconductor device 10 being applied to an n-type metal oxide semiconductor (NMOS) transistor or a p-type metal oxide semiconductor (PMOS) transistor. For example, when the semiconductor device 10 is applied to the NMOS transistor, the source/drain regions 700 may be implanted with N-type impurities such as arsenic and phosphorus. When the semiconductor device 10 is applied to the PMOS transistor, the source/drain regions 700 may be implanted with p-type impurities, such as boron and indium. Afterward, the portion of the gate dielectric layer 430 which is not covered by the gate structure 400 is removed. A self-aligned silicide process is performed to form a silicide 650 on the portions of fin structure 200 on the both sides of the gate structure 400' (i.e., the portions not covered by the gate structure 400'). The silicide 650 may include nickel silicide (NiSi), but not limited thereto. How to form the silicide 650 is well known in the art and is not repeated herein.

Figure 7:
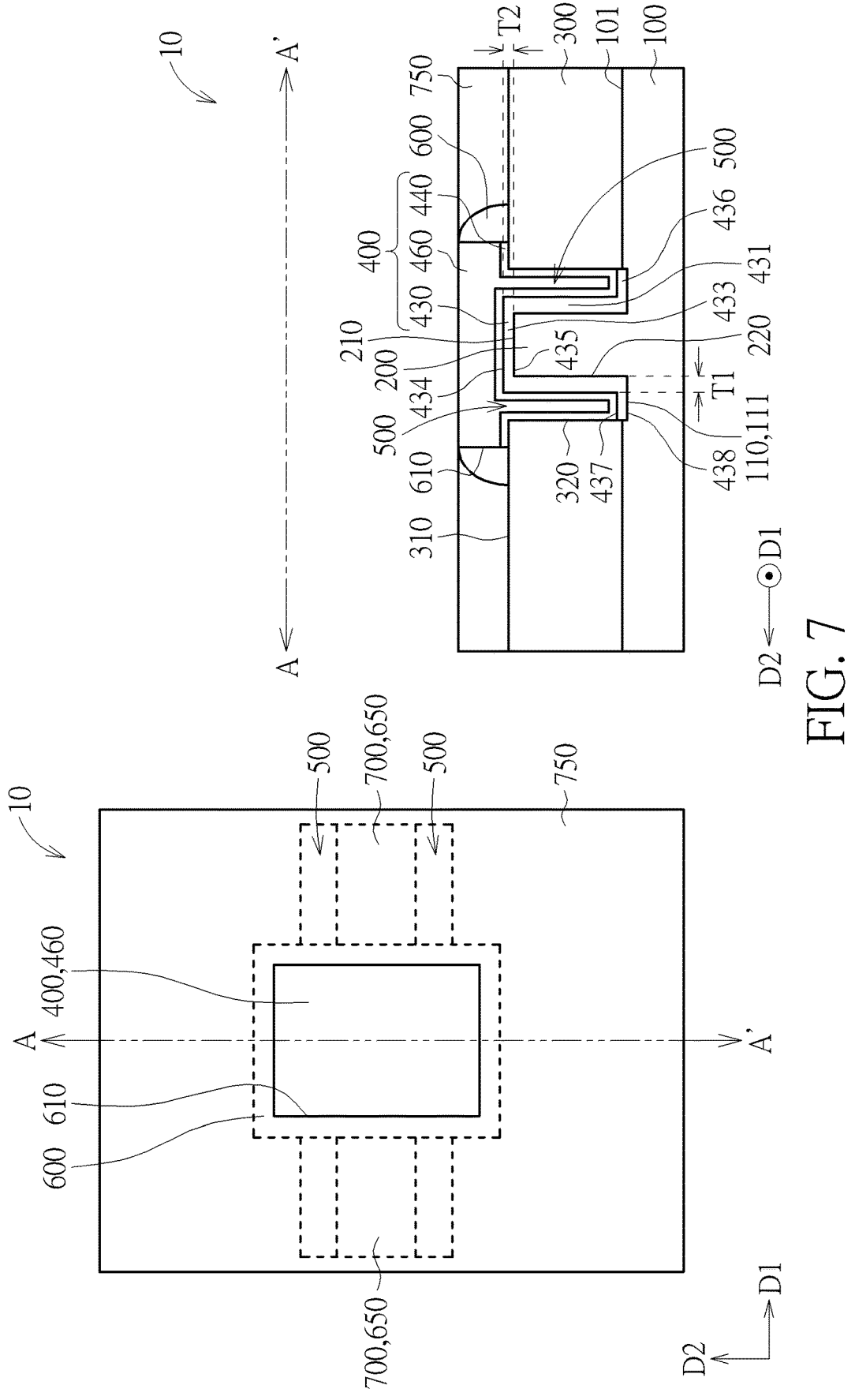

In FIG. 7, the left portion shows a schematic top view of a semiconductor device 10, and the right portion shows a schematic cross-sectional view taken along line A-A' in the left portion. For the sake of simplification, in the schematic top view of the semiconductor device 10, only the metal gate material layer 460 of the gate structure 400, the groove 500, the spacer 600, the silicide 650, the source/drain regions 700 and the dielectric layer 750 are shown, and other elements are omitted. As shown in FIG. 7, a dielectric material may be formed on the insulating structure 300 and the fin structure 200 by a deposition process, and then a portion of the dielectric material is removed by a planarization process, so that a top surface of the remaining dielectric material can be aligned with the top surface of the gate structure 400' to complete the fabrication of the dielectric layer 750. The material of the dielectric layer 750 may include silicon dioxide or tetraethoxysilane (TEOS), but not limited thereto. Afterwards, a replacement metal gate (RMG) process may be performed to replace the gate material layer 450 in FIG. 5 with the metal gate material layer 460 to form a gate structure 400, so as to complete the fabrication of the semiconductor device 10. The metal gate material layer 460 can be a single-layer structure or a multi-layer structure (not shown). For example, the metal gate material layer 460 may include a low-resistance metal layer, and the material of the low-resistance metal layer may include, for example, copper (Cu), aluminum (Al), tungsten (W), titanium aluminum alloy (TiAl), cobalt tungsten phosphide (CoWP) or a combination thereof. The metal gate material layer 460 may further include layers, such as barrier layers and work function metal layers depending on the semiconductor device 10 being applied to an NMOS transistor or a PMOS transistor.

The aforementioned film layers, such as the insulating structure 300, the high-K dielectric layer 440', the gate material layer 450, the metal gate material layer 460, and the dielectric layer 750, may be formed by any suitable methods. For example, the methods may be, but are not limited to, molecular-beam epitaxy (MBE), chemical vapor deposition (CVD), metal organic chemical vapor deposition (MOCVD), hydride vapor phase epitaxy (HVPE) and atomic layer deposition (ALD).

FIG. 7 shows the semiconductor device 10 according to one embodiment of the present disclosure. The semiconductor device 10 includes a fin structure 200, an insulating structure 300, two grooves 500 and a gate structure 400. The fin structure 200 is extended along the first direction D1 on the substrate 100. The insulating structure 300 surrounds the fin structure 200. Each of the grooves 500 is extended along the first direction D1 and disposed between the fin structure 200 and the insulating structure 300. Each of the grooves 500 exposes the first portion 110 of the substrate 100. The gate structure 400 is extended along the second direction D2 on the fin structure 200. At least a portion of the gate structure 400 is disposed in the grooves 500. The gate structure includes a gate dielectric layer 430 disposed on the fin structure 200 and the first portions 110 of the substrate 100. Thereby, the semiconductor device 10 can has a larger effective width, which is favorable for enhancing the transconductance and reducing the noise. Accordingly, the subsequent application of the semiconductor device 10 is improved.

Specifically, the number of the grooves 500 is two. The two grooves 500 are disposed on both sides of the fin structure 200 respectively. The gate dielectric layer 430 is disposed on the fin structure 200 and the first portions 110 of the substrate 100, and the gate dielectric layer 430 is not disposed on the side surfaces 320 of the insulating structure 300 facing the grooves 500. The aforementioned "the gate dielectric layer 430 is not disposed on the side surfaces 320 of the insulating structure 300 facing the grooves 500" refers that the bottom surface (not labeled) of the gate dielectric layer 430 does not contact with the side surfaces 320 directly. The gate dielectric layer 430 may include vertical portions 431 and horizontal portions, such as the first horizontal portion 433 and the second horizontal portions 436. Each of the vertical portions 431 is disposed on the side surface 220 of the fin structure 200, and each of the vertical portions 431 has the first thickness T1. The first horizontal portion 433 is disposed on the top surface 210 of the fin structure 200, and each of the second horizontal portions 436 is disposed on the first portion 110 of the substrate 100 (i.e., on the top surface 111 of the substrate 100). Each of the first horizontal portion 433 and the second horizontal portions 436 has the second thickness T2. The first thickness T1 may be greater than the second thickness T2. For details of the first thickness T1 and the second thickness T2, reference may be made to the above description.

The top surface 434 of the first horizontal portion 433 may be higher than the top surface 310 of the insulating structure 300, and the bottom surface 435 of the first horizontal portion 433 may be lower than the top surface 310 of the insulating structure 300. The top surface 210 of the fin structure 200 may be lower than the top surface 310 of the insulating structure 300. The top surface 437 of the second horizontal portion 436 may be higher than the top surface 101 of the portion of the substrate 100 located below the insulating structure 300, and the bottom surface 438 of the second horizontal portion 436 may be lower than the top surface 101 of the portion of the substrate 100 located below the insulating structure 300. The top surface 111 of the first portion 110 may be lower than the top surface 101 of the portion of the substrate 100 located below the insulating structure 300.

The high-K dielectric layer 440 is disposed on the gate dielectric layer 430 and the side surfaces 320 of the insulating structure 300 facing the grooves 500, and directly contacts the side surfaces 320 of the insulating structure 300. The high-K dielectric layer 440 is only disposed on the bottom portion of the metal gate material layer 460. The high-K dielectric layer 440 is not disposed on the side surfaces 610 of the spacer 600 facing the gate structure 400, and the top surface (not labeled) of the high-K dielectric layer 440 is lower than the top surface (not labeled) of the gate structure 400. The aforementioned "the high-K dielectric layer 440 is not disposed on the side surfaces 610 of the spacer 600 facing the gate structure 400" refers that the bottom surface (not labeled) of the high-K dielectric layer 440 does not directly contact the side surfaces 610. The metal gate material layer 460 is disposed on the high-K dielectric layer 440, at least a portion of the metal gate material layer 460 is disposed in the grooves 500, and at least a portion of the metal gate material layer 460 is disposed on the top surface 310 of the insulating structure 300. Herein, the at least a portion of the metal gate material layer 460 is indirectly disposed on the top surface 310 of the insulating structure 300 through the high-K dielectric layer 440.

Figure 8:
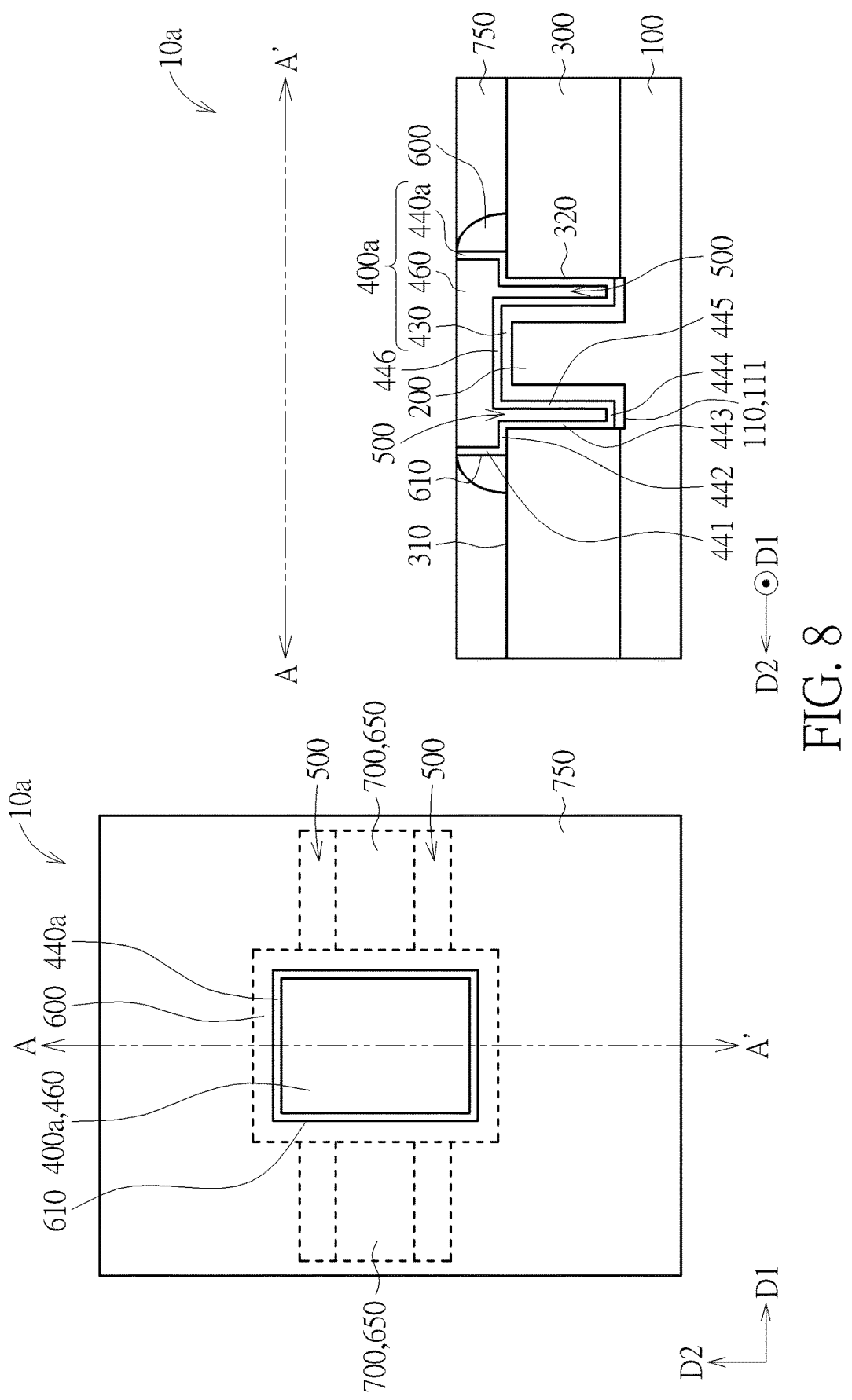
FIG. 8 is a schematic view of a semiconductor device according to another embodiment of the present disclosure.

Please refer to FIG. 8, which is a schematic view of a semiconductor device 10a according to another embodiment of the present disclosure. For the sake of simplification, in the schematic top view of the semiconductor device 10a, only the metal gate material layer 460 and the high-K dielectric layer 440a of the gate structure 400a, the grooves 500, the spacer 600, the silicide 650, the source/drain regions 700 and the dielectric layer 750 are shown, and other elements are omitted. The main difference between the semiconductor device 10a and the semiconductor device 10 is the gate structure 400a being different from the gate structure 400. In the gate structure 400a, the high-K dielectric layer 440 of the gate structure 400 is replaced by the high-K dielectric layer 440a. Specifically, when the replacement metal gate process is performed, both the gate material layer 450 and the high-K dielectric layer 440 are removed, and before depositing the metal gate material layer 460, a new high-K dielectric layer 440a is deposited. Thereby, it is beneficial to improve the stability of the semiconductor device 10a. The material of the high-K dielectric layer 440a can be the same as that of the high-K dielectric layer 440. Compared with the high-K dielectric layer 440, the high-K dielectric layer 440a is disposed on the gate dielectric layer 430 and the sides surface 320 of the insulating structure 300 facing the grooves 500, and is further disposed on the side surfaces 610 of the spacer 600 facing the gate structure 400a. Moreover, the top surface (not labeled) of the high-K dielectric layer 440a is aligned with the top surface (not labeled) of the gate structure 400a. That is, the high-K dielectric layer 440a is disposed both on the bottom portion of the metal gate material layer 460 and the side portion of the metal gate material layer 460. The high-K dielectric layer 440a may include two first vertical portions 441, two first horizontal portions 442, two second vertical portions 443, two second horizontal portions 444, two third vertical portions 445 and a third horizontal portion 446, wherein each of the first vertical portions 441 is disposed above the insulating structure 300 and disposed on the side surface 610 of the spacer 600 facing the gate structure 400a.

Figure 9:
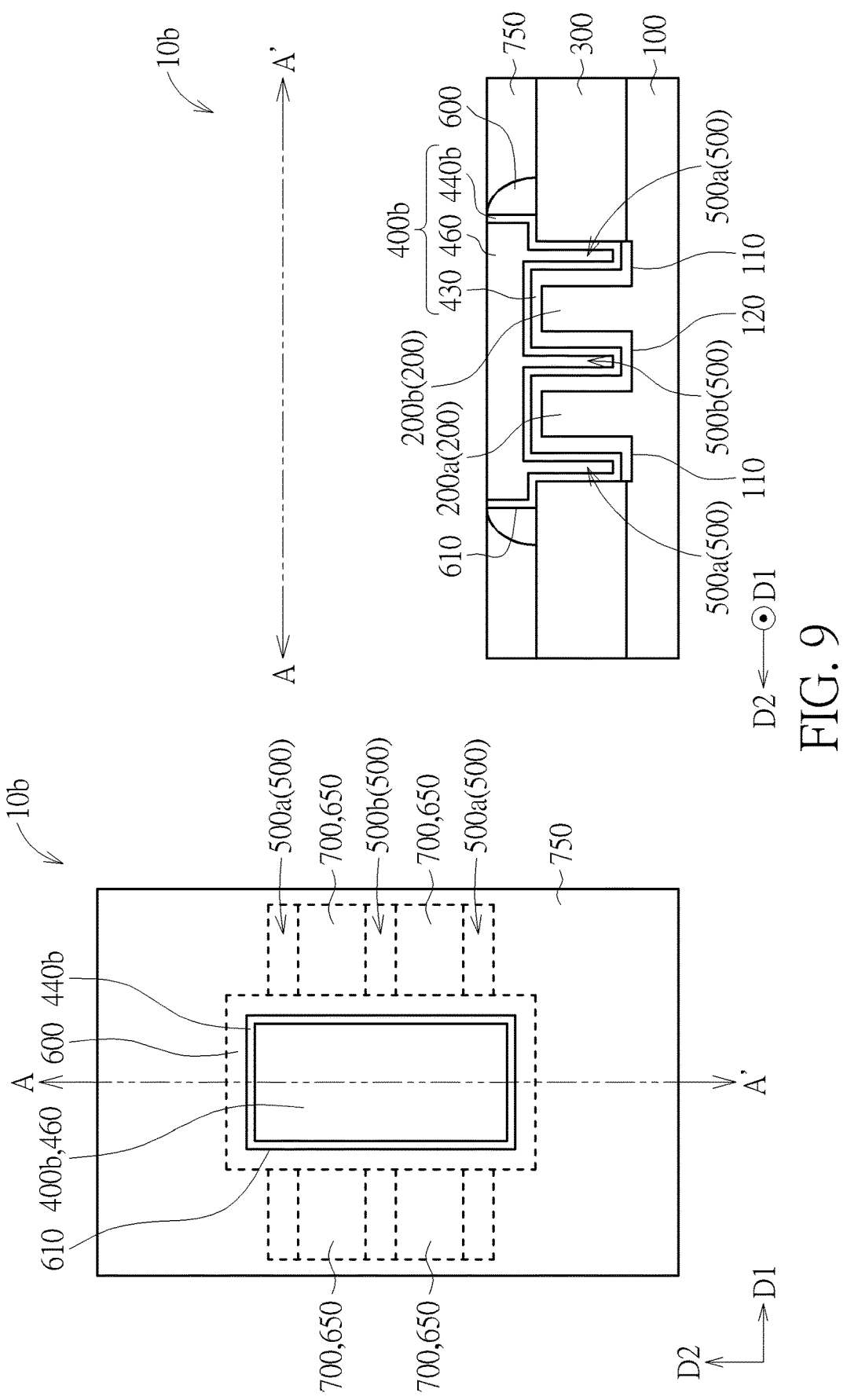
FIG. 9 is a schematic view of a semiconductor device according to further another embodiment of the present disclosure.

Please refer to FIG. 9, which is a schematic view of a semiconductor device 10b according to further another embodiment of the present disclosure. For the sake of simplification, in the schematic top view of the semiconductor device 10b, only the metal gate material layer 460 and the high-K dielectric layer 440b of the gate structure 400b, the grooves 500, the spacer 600, the silicide 650, the source/drain regions 700 and the dielectric layer 750 are shown, and other elements are omitted. The main difference between the semiconductor device 10b and the semiconductor device 10a is the numbers of the fin structures 200 and the grooves 500, and the gate structure 400b is different from the gate structure 400a.

The semiconductor device 10b includes two fin structures 200, which are the first fin structure 200a and the second fin structure 200b. Both the first fin structure 200a and the second fin structure 200b are extended along the first direction D1 on the substrate 100, and the insulating structure 300 surrounds the first fin structure 200a and the second fin structure 200b.

The semiconductor device 10b includes three grooves 500, which are the first groove 500a, the second groove 500b and the first groove 500a from left to right in the left portion of FIG. 9. The first groove 500a on the left side is extended along the first direction D1 and is disposed between the first fin structure 200a and the insulating structure 300. The first groove 500a on the right side is extended along the first direction D1 and is disposed between the second fin structure 200b and the insulating structure 300. Each of the first grooves 500a exposes the first portion 110 of the substrate 100. The second groove 500b is extended along the first direction D1 and is disposed between the first fin structure 200a and the second fin structure 200b. The second groove 500b exposes the second portion 120 of the substrate 100.

The gate structure 400b is extended along the second direction D2 on the first fin structure 200a and the second fin structure 200b, wherein at least a portion of the gate structure 400b is disposed in the first grooves 500a and the second groove 500b, and the gate structure 400b includes a gate dielectric layer 430 disposed on the first fin structure 200a, the second fin structure 200b and the first portions 110 and the second portion 120 of the substrate 100. Similar to the semiconductor device 10a in FIG. 8, the high-K dielectric layer 440 is replaced with the high-K dielectric layer 440b in the replacement metal gate process, but not limited thereto. In other embodiments, in the replacement metal gate process, the high-K dielectric layer 440 is not replaced with the high-K dielectric layer 440b. In this case, the high-K dielectric layer 440 is not disposed on the side surfaces 610 of the spacer 600 facing the gate structure 400b, and the top surface (not labeled) of the high-K dielectric layer 440 is lower than the top surface (not labeled) of the gate structure 400b, which is similar to the semiconductor device 10 in FIG. 7.

In the embodiment, the number of the fin structures 200 is two and the number of the grooves 500 is three, both of which are exemplarily, and the numbers of the fin structures 200 and the grooves 500 can be adjusted according to actual needs.

Compared with the method for fabricating the semiconductor device 10a, the method for fabricating the semiconductor device 10b further includes forming the second fin structure 200b extended along the first direction D1 on the substrate 100 (Step 950), and forming the second groove 500b extended along the first direction D1 and disposed between the first fin structure 200a and the second fin structure 200b. The second fin structure 200b and the first fin structure 200a can be formed simultaneously, and the second groove 500b and the first grooves 500a can be formed simultaneously.

Figure 10:
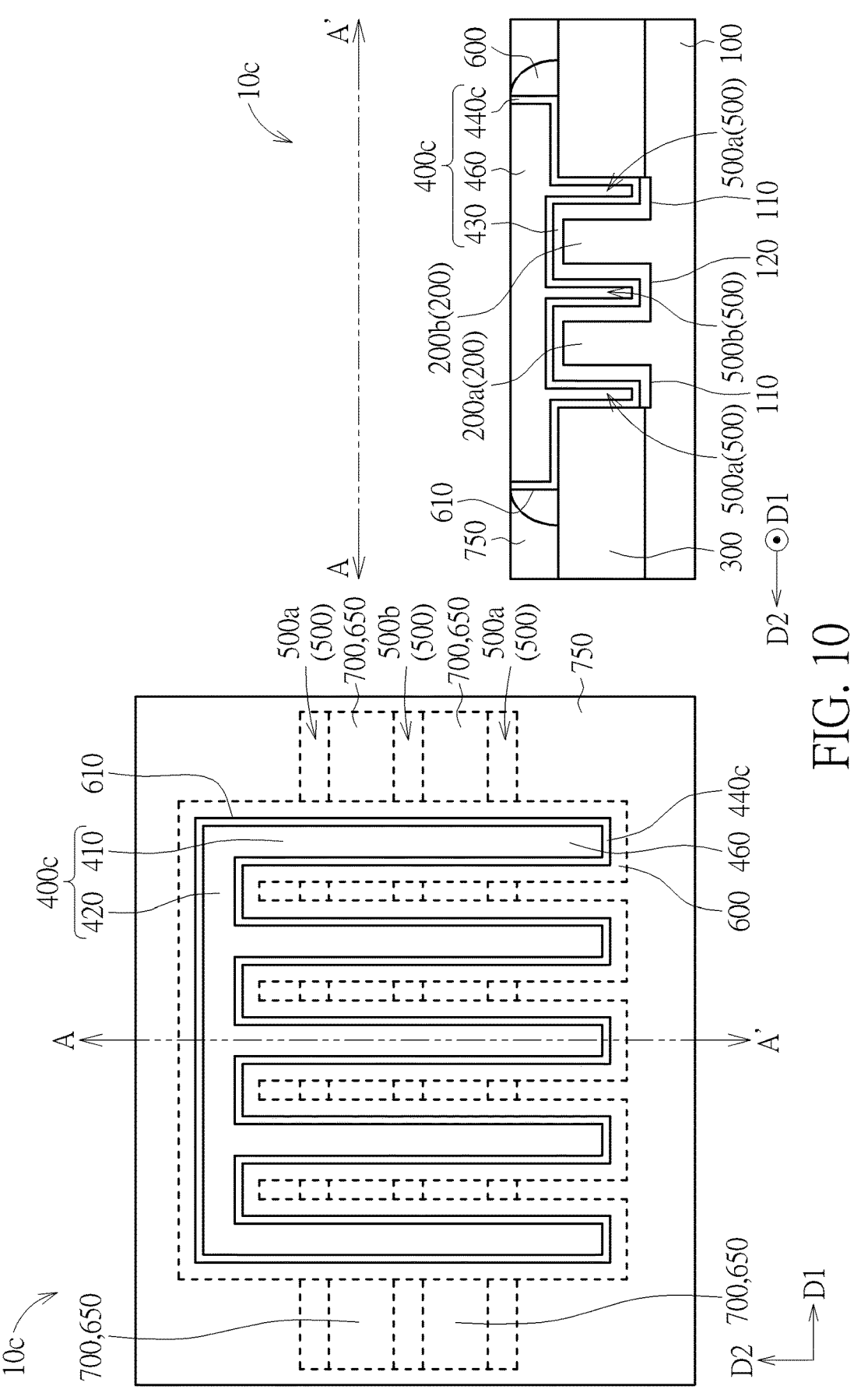
FIG. 10 is a schematic view of a semiconductor device according to yet another embodiment of the present disclosure.

Please refer to FIG. 10, which is a schematic view of a semiconductor device 10c according to yet another embodiment of the present disclosure. For the sake of simplification, in the schematic top view of the semiconductor device 10c, only the metal gate material layer 460, the high-K dielectric layer 440c, the gate portion 410 and the connecting portion 420 of the gate structure 400c, the grooves 500, the spacer 600, the silicide 650, the source/drain regions 700 and the dielectric layer 750 are shown, and other elements are omitted. The main difference between the semiconductor device 10c and the semiconductor device 10b is the gate structure 400c being different from the gate structure 400b. The gate structure 400c includes a plurality of gate portions 410 and a connecting portion 420, the plurality of gate portions 410 are extended along the second direction D2, the connecting portion 420 connects the plurality of gate portions 410, and the connecting portion 420 is extended along the first direction D1. At least a portion of each of the gate portions 410 is disposed in the first grooves 500a and the second groove 500b. Each of the gate portions 410 includes a gate dielectric layer 430 disposed on the first fin structure 200a, the second fin structure 200b and the first portions 110 and the second portion 120 of the substrate 100. By the plurality of gate portions 410, the distance between two source/drain regions 700 on the same fin structure 200 can be increased, which is beneficial to reduce the leakage current. In the embodiment, the number of the fin structures 200 is two, the number of the grooves 500 is three, and the number of the gate portions 410 is five, which are exemplarily, and the number of the fin structures 200, the grooves 500 and the gate portions 410 can be adjusted according to actual needs.

Compared with the prior art, the semiconductor device according to the present disclosure can be featured with a larger effective width, which is favorable for enhancing the transconductance and reducing the noise. Accordingly, the subsequent application of the semiconductor device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a plurality of fin structures extended along a first direction on a substrate;
   an insulating structure surrounding the plurality of fin structures;
   a plurality of first grooves extended along the first direction, wherein each of the first grooves is disposed between one of the fin structures and the insulating structure, and each of the first grooves exposes a first portion of the substrate;
   at least one second groove extended along the first direction, wherein the at least one second groove is disposed between two of the fin structures, and the at least one second groove exposes a second portion of the substrate; and
   a gate structure disposed on the plurality of fin structures, wherein the gate structure comprises a plurality of gate portions extended along a second direction, two of the gate portions adjacent to each other have a spaced distance therebetween in the first direction, at least a portion of each of the gate portions is disposed in the plurality of first grooves and the at least one second groove, and each of the gate portions comprises a gate dielectric layer disposed on the plurality of fin structures and the first portion and the second portion of the substrate.

2. The semiconductor device of claim 1, wherein the gate dielectric layer comprises:
   a vertical portion disposed on a side surface of each of the fin structures, wherein the vertical portion has a first thickness; and
   a horizontal portion disposed on a top surface of each of the fin structures and the first portion and the second portion of the substrate, wherein the horizontal portion has a second thickness, and the first thickness is greater than the second thickness.

3. The semiconductor device of claim 2, wherein a ratio of the first thickness to the second thickness is 1.05 to 1.25.

4. The semiconductor device of claim 2, wherein the horizontal portion comprises a first horizontal portion disposed on the top surface of each of the fin structures, a top surface of the first horizontal portion is higher than a top surface of the insulating structure, and a bottom surface of the first horizontal portion is lower than the top surface of the insulating structure.

5. The semiconductor device of claim 1, wherein the gate dielectric layer is not disposed on a side surface of the insulating structure facing the first groove.

6. The semiconductor device of claim 1, wherein each of the gate portions further comprises a high dielectric constant dielectric layer disposed on the gate dielectric layer and a side surface of the insulating structure facing the first groove.

7. The semiconductor device of claim 1, wherein the gate structure further comprises a connecting portion connects the plurality of the gate portions.

8. A method for fabricating a semiconductor device, comprising:

forming a first fin structure extended along a first direction on a substrate;

forming an insulating structure surrounding the first fin structure;

forming a first groove by removing a portion of the insulating structure, wherein the first groove is extended along the first direction and disposed between the first fin structure and the insulating structure, and the first groove exposes a first portion of the substrate; and forming a gate structure extended along a second direction on the first fin structure, wherein at least a portion of the gate structure is disposed in the first groove, and the gate structure comprises a gate dielectric layer disposed on the first fin structure and the first portion of the substrate.

9. The method of claim 8, wherein the gate dielectric layer is formed by a thermal oxidation process.

10. The method of claim 8, wherein the gate dielectric layer comprises:

a vertical portion disposed on a side surface of the first fin structure, wherein the vertical portion has a first thickness; and a horizontal portion disposed on a top surface of the first fin structure and the first portion of the substrate, wherein the horizontal portion has a second thickness, and the first thickness is greater than the second thickness.

11. The method of claim 10, wherein a ratio of the first thickness to the second thickness is 1.05 to 1.25.

12. The method of claim 8, wherein the gate structure further comprises a high dielectric constant dielectric layer disposed on the gate dielectric layer and a side surface of the insulating structure facing the first groove.

13. The method of claim 8, further comprising:

forming a second fin structure extended along the first direction on the substrate; and forming a second groove extended along the first direction and between the first fin structure and the second fin structure, wherein the second groove exposes a second portion of the substrate, and the gate dielectric layer is further disposed on the second fin structure and the second portion of the substrate.

* * * * *